United States Patent
Ngo et al.

(10) Patent No.: US 6,562,416 B2
(45) Date of Patent: May 13, 2003

(54) METHOD OF FORMING LOW RESISTANCE VIAS

(75) Inventors: Minh Van Ngo, Fremont, CA (US); Robert A. Huertas, Hollister, CA (US); Dawn Hopper, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 36 days.

(21) Appl. No.: 09/846,187

(22) Filed: May 2, 2001

(65) Prior Publication Data

US 2002/0162736 A1 Nov. 7, 2002

(51) Int. Cl.[7] ............................. C23C 14/02; H05H 1/24; H01L 21/20; H01L 21/44; H01L 21/302
(52) U.S. Cl. ................... 427/534; 427/576; 204/192.32; 204/192.35; 438/479; 438/622; 438/653; 438/714; 438/720; 438/734
(58) Field of Search ..................... 204/192.32, 192.35; 427/534, 576, 307, 331; 438/629, 644, 479, 622, 653, 654, 687, 694, 700, 714, 720, 734

(56) References Cited

U.S. PATENT DOCUMENTS

| 6,136,680 | A | * | 10/2000 | Lai et al. ..................... 438/597 |
| 6,174,810 | B1 | * | 1/2001 | Islam et al. ................. 438/687 |
| 6,294,832 | B1 | * | 9/2001 | Yeh et al. .................... 257/751 |
| 6,352,917 | B1 | * | 3/2002 | Gupta et al. ................ 438/622 |
| 2002/0009872 | A1 | * | 1/2002 | Hoshino et al. ............ 438/618 |

* cited by examiner

*Primary Examiner*—Steven H. VerSteeg

(57) ABSTRACT

Low resistant vias are formed by sequentially treating an opening in an interlayer dielectric and the exposed surface of a lower metal feature with an $NH_3$ plasma followed by a $N_2/H_2$ plasma, thereby removing any oxide on the metal surface and removing residual polymers or polymeric deposits generated during etching to form the opening. Embodiments include forming a dual damascene opening in a low-k interlayer dielectric exposing the upper surface of a lower Cu or Cu alloy feature, sequentially treating the opening and the upper surface of the lower metal feature with an $NH_3$ plasma and then with a $N_2/H_2$ plasma, Ar sputter etching, depositing a barrier layer lining the opening, depositing a seedlayer and filling the opening with Cu or a Cu alloy.

12 Claims, 5 Drawing Sheets

METHOD OF FORMING LOW RESISTANCE VIAS

TECHNICAL FIELD

The present invention relates to a method of manufacturing a semiconductor device exhibiting reduced capacitance loading, improved electromigration resistance and increased reliability. The present invention has particular applicability in manufacturing high density, multi-level semiconductor devices comprising sub-micron dimensions having low resistance vias and exhibiting rapid circuit speed.

BACKGROUND ART

As integrated circuit geometries continue to plunge deeper into the sub-micron regime, it becomes increasingly difficult to satisfy the demands for dimensional accuracy. Moreover, interconnection technology is constantly challenged to satisfy the ever increasing requirements for high performance associated with ultra large scale integration semiconductor devices. The speed of semiconductor circuitry varies inversely with the resistance (R) and capacitance (C) of the interconnection system. The higher the value of the R×C product, the more limiting the circuit speed. As integrated circuits become complex and feature sizes and spacings become smaller, the integrated circuit speed becomes less dependent upon the transistor itself and more dependent upon the interconnection pattern. Thus, the performance of multi-level interconnects is dominated by interconnect capacitance at deep sub-micron regimes, e.g., less than about 0.12 micron. The rejection rate due to integrated circuits speed delays in sub-micron regimes has become a limiting factor in fabrication.

Conventional semiconductor devices comprise a semiconductor substrate, typically doped monocrystalline silicon, and a plurality of sequentially formed interlayer dielectrics and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns of different levels, i.e., upper and lower levels, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as feature sizes shrink into the deep sub-micron regime.

A conductive plug filling a via bole is typically formed by depositing an interlayer dielectric (ILD) on a metal level comprising at least one metal feature, forming an opening through the ILD by conventional photolithographic and etching techniques, and filling the opening with a conductive material. The excess conductive material or overburden on the surface of the ILD is typically removed by chemical-mechanical polishing (CMP). One such method is known as damascene and basically involves forming an opening in the ILD, such as a trench or via hole, and filling the opening with a metal to form a metal line or via, respectively. Dual damascene techniques involve forming an opening comprising a lower contact or via hole section in communication with an upper trench section, and filling the opening with a conductive material, typically a metal, to simultaneously form a lower contact or via in contact with an upper conductive line.

Copper (Cu) and Cu alloys have received considerable attention as alternative metallurgy to aluminum (Al) in interconnect metallizations. Cu is relatively inexpensive, easy to process, and has a lower resistively than Al. In addition, Cu has improved electrical properties vis-a-vis tungsten (W), making Cu a desirable metal for use as a conductive plug as well as conductive wiring. However, due to Cu diffusion through dielectric materials, such as silicon dioxide, Cu interconnect structures must be encapsulated by a diffusion barrier layer. Typical diffusion barrier materials include tantalum (Ta), tantalum nitride (TaN), titanium (Ti), titanium nitride (TiN), titanium-tungsten (TiW), Tungsten (W), tungsten nitride (WN), Ti—TiN, titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the ILD, but includes interfaces with other metals as well.

Cu interconnect technology, by and large, has been implemented employing damascene techniques, wherein a dielectric layer, e.g., interlayer dielectric, is formed over a patterned underlying metal level having a capping layer thereon, e.g., Cu or Cu alloy features with a silicon nitride capping layer. An opening is formed in the dielectric layer. A barrier layer and optional seedlayer are then sequentially deposited, followed by Cu deposition, as by electrodeposition or electroless deposition.

The dielectric constant of materials currently employed in the manufacture of semiconductor devices for an interlayer dielectric (ILD) ranges from about 3.9 for dense silicon dioxide to over 8.0 for deposited silicon nitride. In an effort to reduce interconnect capacitance, dielectric materials with lower values of permitivity have been explored. The expression "low-k" material has evolved to characterize materials with a dielectric constant less than about 3.9, based upon a value of the dielectric constant of a vacuum as one (1). One type of low-k material that has been explored are a group of spin on or CVD siloxane materials, such as hydrogen silsesquioxane (HSQ) and methyl silsequioxane (MSQ) and BLACK-DIAMOND™ dielectric available for Applied Materials, Santa Clara, Calif. and silicon-carbon-oxygen-hydrogen (SiCOH) organic dielectrics. There are several organic low-k materials, typically having a dielectric constant of about 2.0 to about 3.8, which offer promise for use as an ILD, such as FLARE 20™ dielectric, a poly(arylene) ether, available from Allied Signal, Advanced Micromechanic Materials, Sunnyvale, Calif. BCB (divinylsiloxane bis-benzocyclobutene) and SILK™ dielectric, an organic polymer similar to BCB, both available from Dow Chemical Co., Mildland, Mich.

In implementing Cu and/or Cu alloy damascene techniques to form interconnection patterns with dimensions in the deep sub-micron regime, particularly when employing various low-k materials, including porous oxides, such as dielectric oxides having a porosity of about 30% to about 80% and a dielectric constant (k) of about 2.0 or lower, various problems evolve which degrade the resulting semiconductor device. For example, copper readily diffuses into conventional silicon-based materials such as polysilicon, single-crystalline silicon, silicon dioxide, and low-k inorganic and organic materials. Once semiconductive silicon-based materials are Cu doped, transistors made within or in close proximity to the Cu doped silicon-based regions either cease to function properly or are significantly degraded in electrical performance.

Several dielectric materials have evolved which contain halogens, such as fluorine (F), e.g., F-doped silicon dioxide derived from tetraethyl orthosilicate (F-TEOS) and F-doped silicate glass (FSG). In implementing conventional damascene techniques with Cu, it was found that the barrier layer initially deposited to line the opening does not adhere well to the dielectric layer, particularly F-containing low-k ILDs such as F-TEOS and FSG. Such an adhesion problems adversely impact electromigration resistance and device reliability.

Additional problems attendant upon implementing Cu or Cu alloy interconnect technology stem from the difficulty in removing a thin copper oxide film formed on the upper surface of the lower Cu or Cu alloy metal feature by chemical mechanical polishing (CMP), leading to voids, electromigration problems and increasing vias resistance. Another source of via resistance stems from the presence of polymers or polymeric deposits generated by anisotropic etching to form the opening in the dielectric layer.

In addition, conventional practices employ an argon (Ar) sputter etching technique to round the corners of the opening to facilitate filling, to remove surface oxides from the underlying metal feature and to remove residual contamination. However, such Ar sputter etching typically removes a portion of the upper surface of the lower Cu or Cu alloy feature which redeposits on the side surfaces of the dielectric layer defining the opening formed therein. The resulting structure would contain Cu between the subsequently deposited barrier metal and dielectric layer which ultimately penetrates the dielectric layer and eventually poisons one or more transistors of the device.

Accordingly, there exists a need for efficient methodology enabling the formation of interconnection structures containing low resistance vias. There exists a particular need for efficient methodology enabling the formation of low resistance Cu or Cu alloy interconnection structures exhibiting high reliability and high electromigration resistance.

DISCLOSURE OF THE INVENTION

An advantage of the present invention is a method of manufacturing a semiconductor device having low resistance vias.

Another advantage of the present invention is a method of manufacturing a semiconductor device with Cu and/or Cu alloy interconnection patterns in low-k dielectric layers exhibiting reduced parasitic RC time delays, improved electromigration resistance, reduced via resistance and increased device reliability.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming an opening in a dielectric layer exposing an upper surface of a lower metal feature; and sequentially treating the opening and upper surface of the lower metal feature with: (a) a plasma containing ammonia ($NH_3$); following by (b) a plasma containing nitrogen ($N_2$) and hydrogen ($H_2$).

Embodiments of the present invention comprise forming a dual damascene opening in an interlayer dielectric comprising a dielectric material having a dielectric constant less than about 3.9, the opening exposing an upper surface of a lower Cu feature, sequentially treating the opening and upper surface of the lower Cu feature with an $NH_3$ plasma followed by an $N_2/H_2$ plasma. Subsequently, a barrier layer is deposited lining the opening, a seedlayer deposited thereon, and the opening filled with Cu followed by CMP and deposition of a capping layer, such as silicon nitride or silicon carbide. Embodiments of the present invention further include the use of low-k dielectric materials, such as F-TEOS, SLCOH and BLACK-DIAMOND™ dielectric. As used throughout this disclosure, the symbol "Cu" is intended to include substantially pure elemental copper, copper containing unavoidable impurities and copper alloys containing minor amounts of elements such as tantalum, indium, tin, zinc, manganese, chromium, titanium, germanium, strontium, platinum, magnesium, aluminum or zironcium.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded and illustrative in nature, and not as restrictive.

DESCRIPTION OF THE INVENTION

Figure 1:
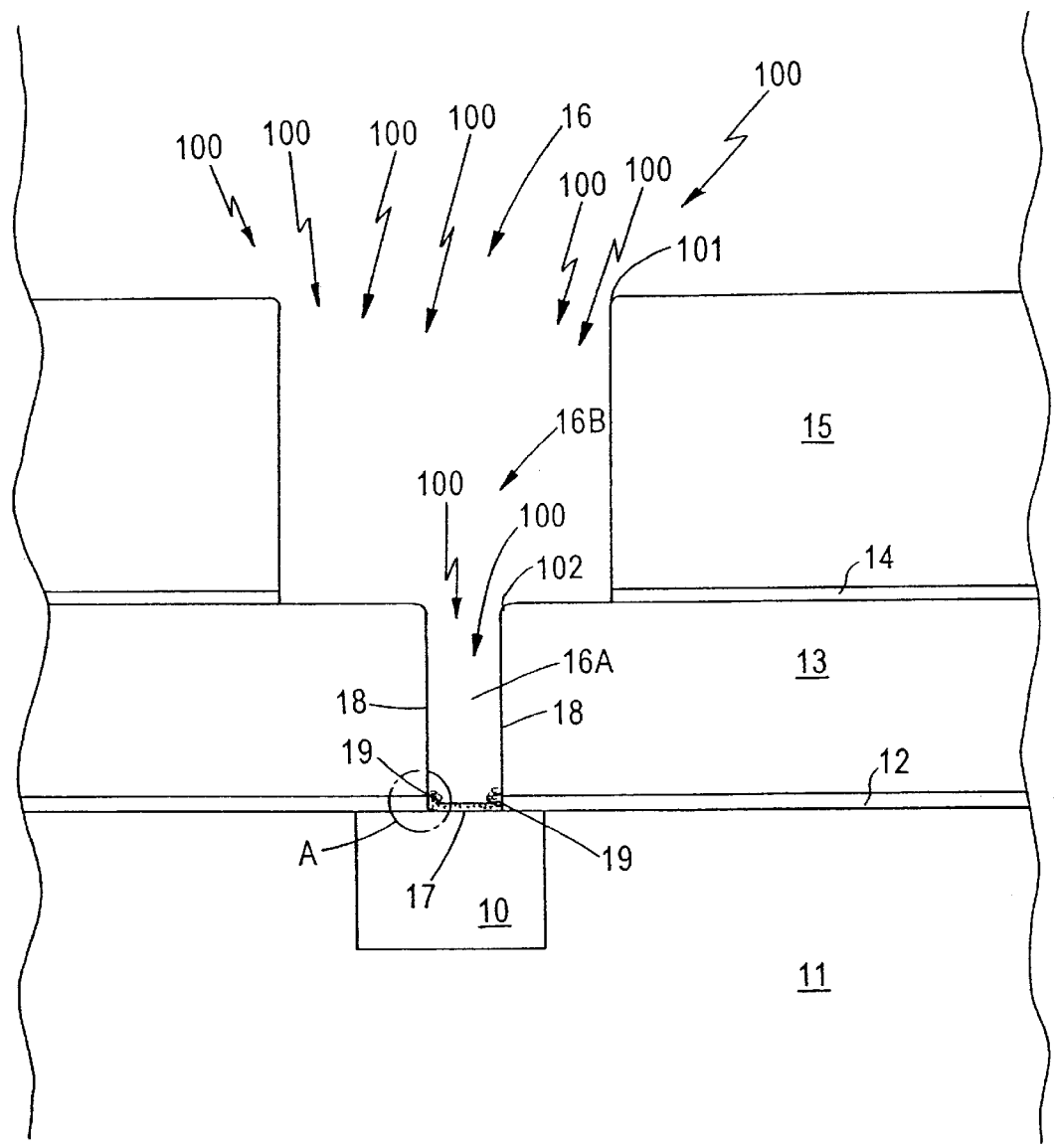
FIG. 1 schematically illustrates a prior art technique resulting in high via resistance and Cu redeposition on side surfaces of a dielectric layer defining an opening in a dielectric layer.
Figure 2:
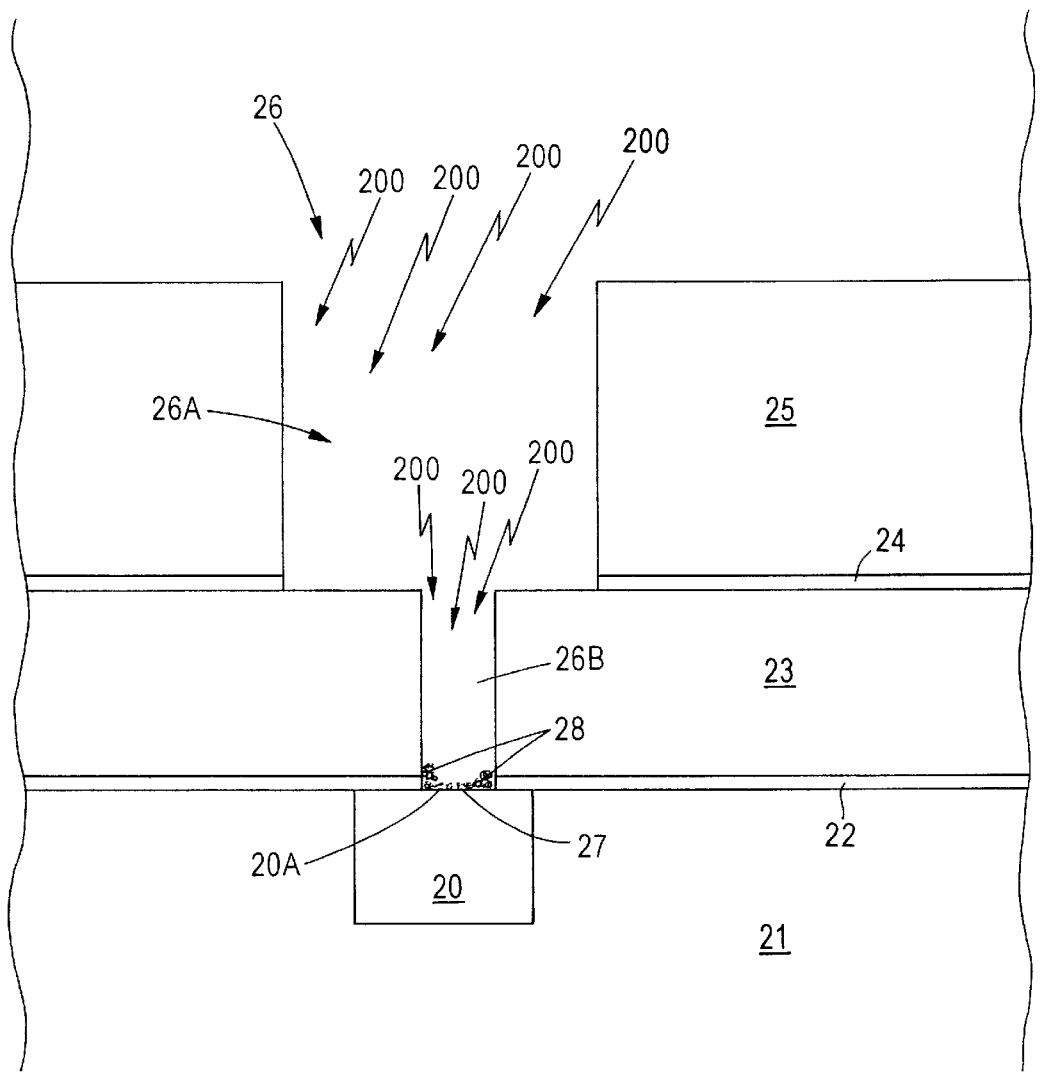
FIGS. 2 through 5 schematically illustrate sequential phases of a method in accordance with an embodiment of the present invention.
Figure 3:
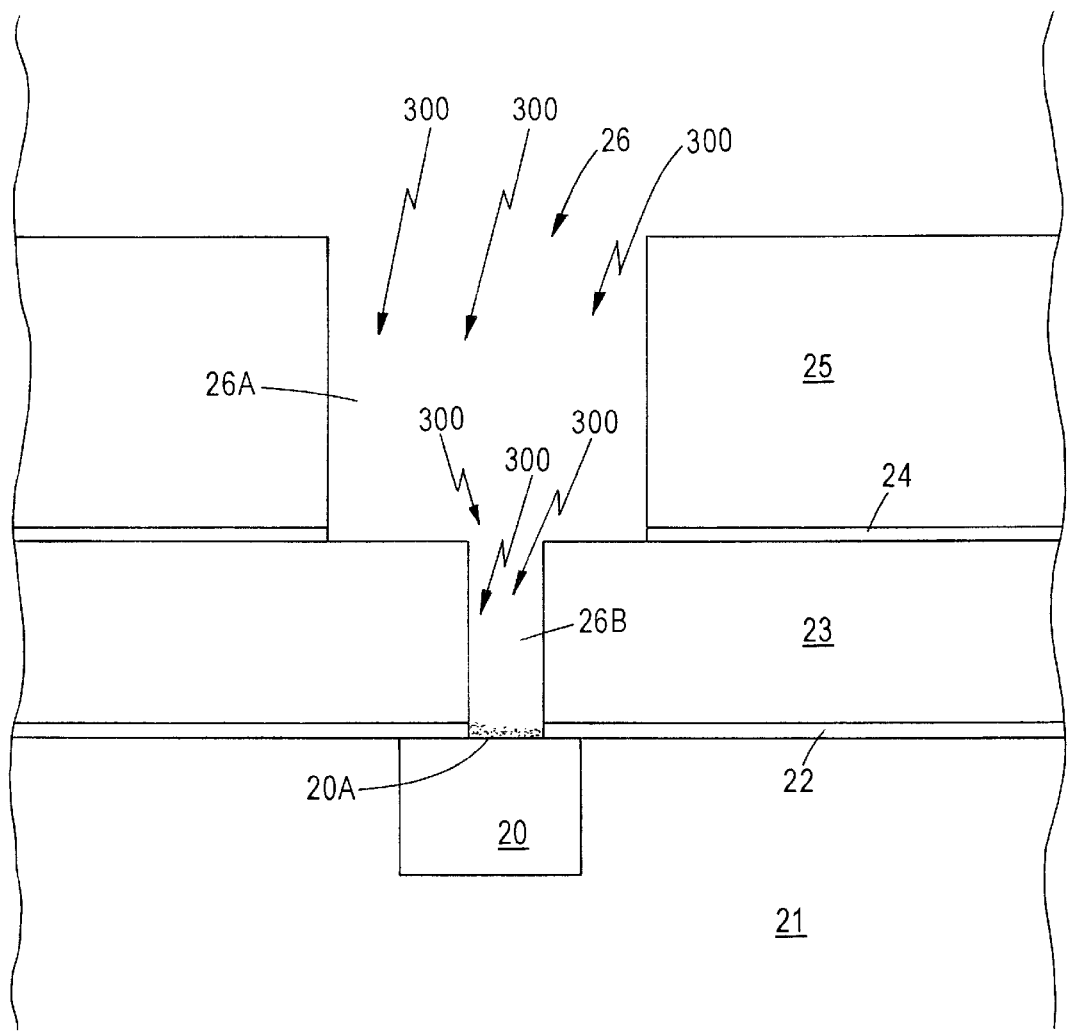

Upon implementing conventional interconnect technology with Cu various issues are generated adversely impacting via resistance and device reliability, such as the formation of a thin film of copper oxide on the upper surface of the lower metal feature, polymeric deposits generated by aniostropic etching and redeposition of copper on the side surfaces of the interlayer dielectric. Adverting to FIG. 1, a typical dual damascene opening is schematically illustrated by reference numeral 16 and comprises an upper trench section 16B formed in dielectric layer 15 connected to a lower via opening section 16A formed in dielectric layer 13 exposing an upper surface of lower Cu feature 10 formed in dielectric layer 11. Capping layer 12 is formed between dielectric layers 11 and 13, while middle etch stop layer 14 is formed between dielectric layers 13 and 15. The upper surface of lower Cu feature 10 typically contains a thin copper oxide surface film, believed to comprise a mixture of CuO and $Cu_2O$ generated during CMP. The thin copper layer oxide surface film 17 is porous and brittle in nature, thereby generating voids as well as adversely impacting the integrity of the interconnection and increasing via resistance. In addition, as a result of anisotropic etching to form the dual damascene opening 16, polymeric deposits 19 typically accumulate, as in a corner A, adversely impacting via resistance. Further, after forming dual damascene opening 16, Ar sputter etching, illustrated by zigzag arrows 100, is typically performed to round the exposed corners 101, 102 of dielectric layers 15, 13, respectively, and to remove oxides and contamination. The use of Ar sputter etching has been found less than completely effective for removal of contamination and oxide film 17. Moreover, during Ar sputter etching, Cu is removed from the upper surface of a Cu feature 10 and redeposits as a layer 18 on the side surfaces of dielectric layer 13. The resulting structure would contain Cu between the subsequently deposited barrier metal and dielectric layer 13, which redeposited Cu would ultimately penetrate dielectric layer 13 and eventually poison one or more transistors of the device.

The present invention addresses and solves high via resistance and problems attendant upon fabricating multilayer interconnect semiconductor devices, particularly employing low-k materials to reduce parasitic RC time delays, when implementing Cu interconnect technology. The present invention particularly addresses and solves the above problems by providing efficient, cost effective methodology to decrease via resistance. Moreover, embodiments of the present invention enable formation of Cu interconnects using low-k materials employing methodology which effectively cleans the upper surface of the lower Cu metal feature of oxide, and effectively removes polymeric deposits generated during CMP, thereby enabling a significant reduction in the time required for Ar sputter etching and, consequently eliminating or significantly reducing redeposition of Cu on the side surfaces of the dielectric layer.

In accordance with embodiments of the present invention, a dual damascene (structure is formed in dielectric layers, such as low-k dielectric layers, e.g., F-TEOS, SiCOH or a BLACK-DIAMOND™ dielectric. Either via first—trench last or trench first—via last damascene techniques can be employed to form the dual damascene structure. After forming the dual damascene structure, embodiments of the present invention include strategically treating the opening and upper surface of the lower Cu feature with a $NH_3$ plasma and subsequently with a $N_2/H_2$ plasma. Such sequential treatments with an $NH_3$ plasma followed by a $N_2/H_2$ plasma chemically reduce any copper oxide formed on the upper surface of the lower Cu feature and remove residual polymeric deposits at the bottom of the via opening, thereby significantly reducing via resistance, e.g., by as much as 25%. Moreover, the strategic sequential plasma treatments in accordance with the present invention significantly reduce the amount of time required for Ar sputter etching, e.g., by about 50%, thereby eliminating or substantially reducing Cu redeposition on the side surface of the dielectric layer defining the via. The resulting Cu interconnect structure exhibits significantly improved reliability, improved electromigration resistance and, significantly, a dramatic decrease in via resistance.

An embodiment of the present invention is schematically illustrated in FIGS. 2 through 5, wherein similar elements or features are denoted by similar reference numerals. Adverting to FIG. 2, a lower Cu feature 20 is formed in a dielectric layer 21, e.g., a low-k dielectric layer, such as F-TEOS, SiCOH or a BLACK-DIAMOND™ dielectric. A capping layer 22, such as silicon nitride or silicon carbide, is formed thereon. Another low-k dielectric layer 23 is formed on capping layer 22. A middle etch stop layer 24, such as silicon nitride or silicon carbide, is formed on dielectric layer 23, and another low-k dielectric layer 25 formed on middle etch stop layer 24. The dual damascene opening is denoted by reference numeral 26 comprises an upper trench section 26A connected to a lower via opening section 26B exposing an upper surface 20A of lower Cu feature 20. The dual damascene opening 26 can be formed by a via first—trench last or by a trench first—via last dual damascene technique. Typically, a layer of copper oxide 27 exists on the upper surface 20A of Cu feature 20, believed to be formed during CMP when planarizing Cu feature 20. In addition, as a result of the anisotropic etching to form dual damascene opening 26, polymeric particles, 28, typically accumulate in a via corner. The photoresist mask (not shown for lucrative convenience) employed in forming the dual damascene structure is typically removed by ashing using an oxygen plasma. In addition, solvent cleaning, as with ammonium hydroxide, is typically conducted after photoresist mask removal.

Subsequently, in accordance with embodiments of the present invention, the entire dual damascene opening 26, including trench section 26A and via opening section 26B, and the upper surface 20A of Cu feature 20, are treated with a $NH_3$ plasma, illustrated by zigzag arrows 200. Subsequently, the dual damascene opening 26, including trench section 26A and via opening section 26B, and the upper surface 20A of Cu feature 20, are treated with an $N_2/H_2$ plasma, schematically illustrated by zigzag arrows 300 in FIG. 3. As a result of the sequential $NH_3$ and $N_2/H_2$ plasma treatments, the oxide layer 27 on the upper surface 20A of Cu feature 20 is effectively reduced and the polymeric deposits 28 at the bottom of the via opening 26B generated during anisotropic etching to form the dual damascene opening are removed.

Figure 4:
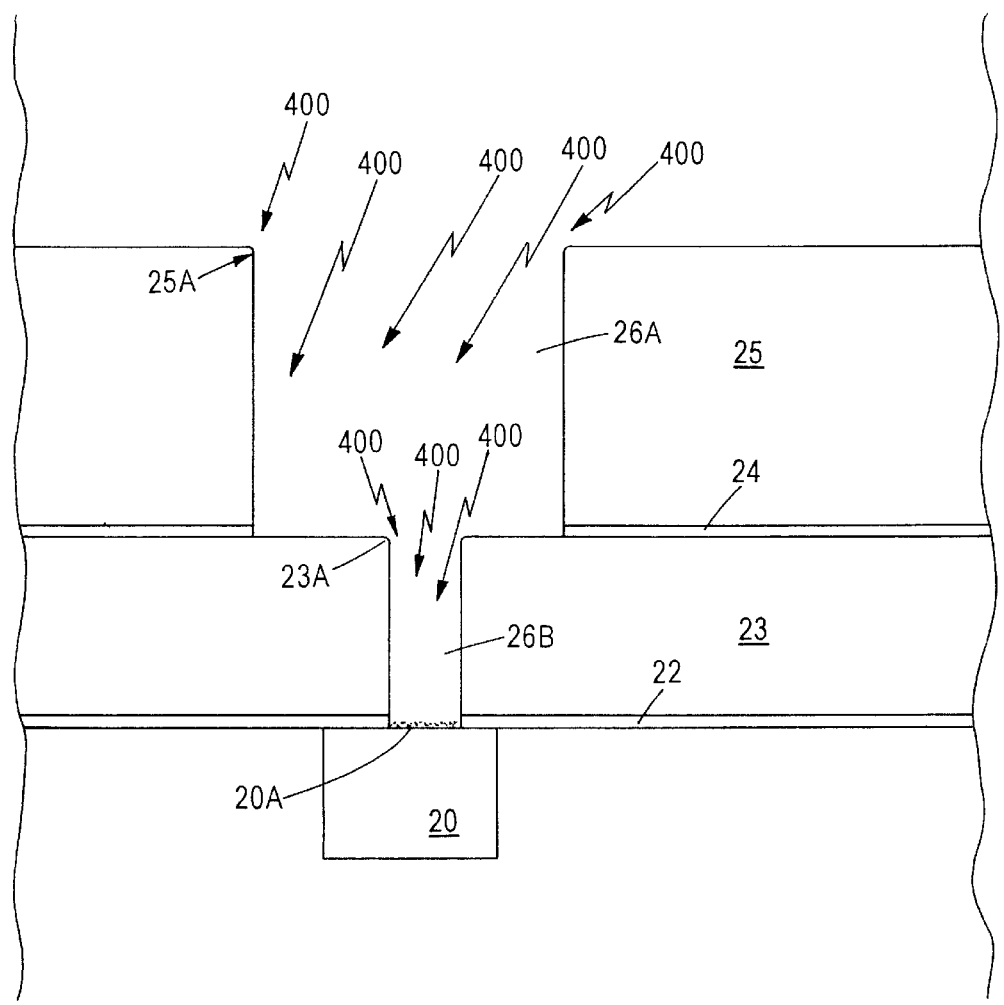
Figure 5:
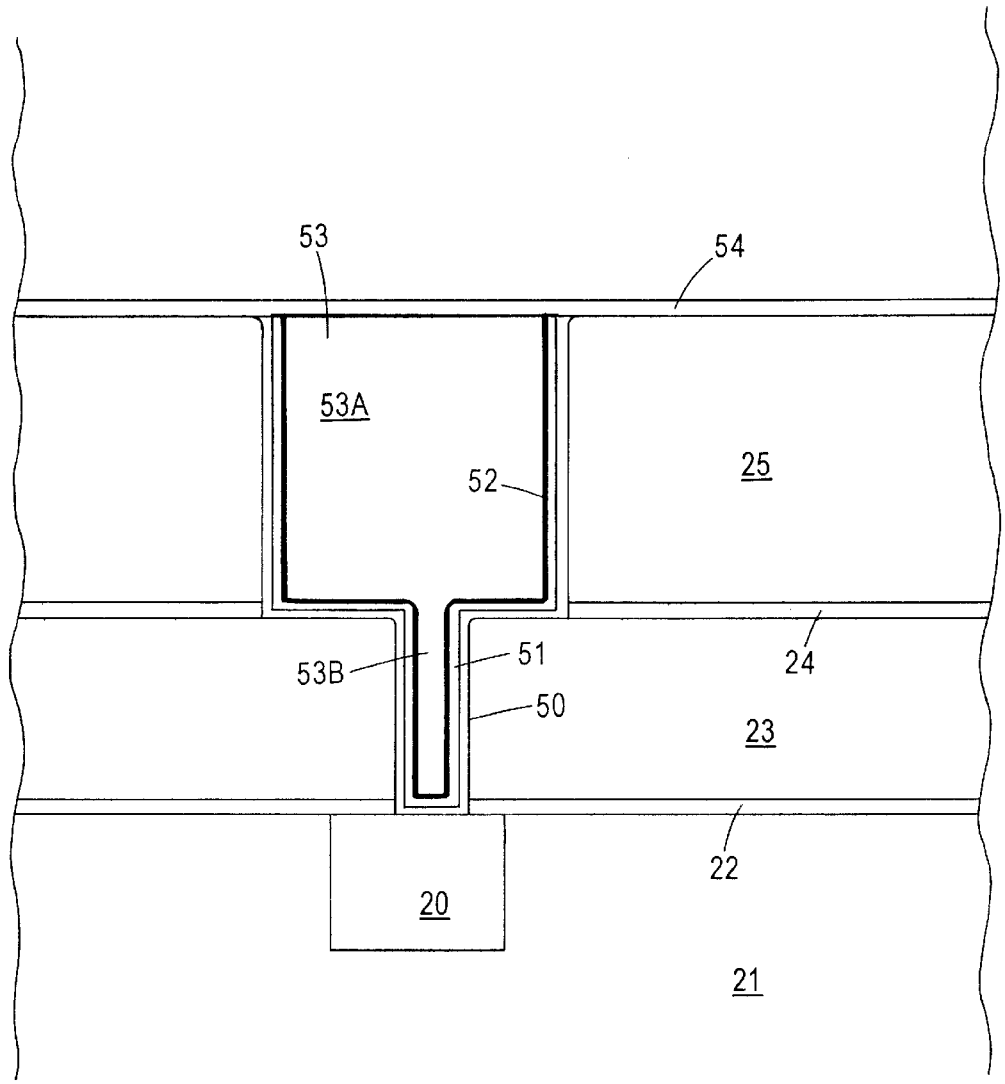

Subsequent processing in accordance with embodiments of the present invention comprise Ar sputter etching, as schematically illustrated by zigzag arrows 400 in FIG. 4, to round the corners 23A and 25A of low-k dielectric layers 23 and 25, respectively. Advantageously, as a result of the previous sequential $NH_3$ and $N_2/H_2$ plasma treatments, the duration of the Ar sputter etching 400 is significantly reduced, as by about 50%, thereby eliminating or significantly reducing any redeposition of Cu from Cu feature 20 on the side surfaces of low-k dielectric layer 23. Subsequent processing in accordance with embodiments of the present invention include depositing a barrier layer or layers, such as a TaN layer 50, a Ta layer 51, and a seedlayer 52, followed by electrodeposition or electroless deposition of Cu 53 to form a dual damascene structure comprising Cu via 53B electrically connected to lower Cu feature 20 and in contact with upper Cu feature or line 53A. CMP is then conducted to planarize the upper surface and a capping layer 54, such as silicon nitride or silicon carbide, is deposited.

In accordance with embodiments of the present invention, the conditions for plasma treatment and Ar sputter etching can be optimized in a particular situation. For example, it was found suitable to conduct the $NH_3$ plasma treatment at an $NH_3$ flow rate of about 130 to about 430 sccm, a $N_2$ flow rate of about 5,000 to about 9,000 sccm, a pressure of about 2.8 to about 6.8 Torr and an RF power of about 100 to about 300 watts for a period of about 10 seconds to about 40 seconds. It was also found suitable to conduct the $N_2/H_2$ plasma treatment at a $H_2$ flow rate of about 150 to about 350 sccm, a $N_2$ flow rate of about 2,000 to about 8,000 sccm, a pressure of about 2.8 to about 6.8 Torr and an RF power of about 150 to about 550 watts, as for a period of about 10 to about 40 seconds.

In addition, as a result of the $NH_3$ and $N_2/H_2$ plasma treatments, it was found suitable to conduct Ar sputter etching at an Ar flow rate of about 4 to about 6 sccm, e.g., about 5 sccm; a source RF power of about 180 to about 220 watts, e.g.; about 200 watts, and a wafer RF power of about 180 to about 200 watts, e.g., about 200 watts, for a period of time of about 4 to about 6 seconds, which constitutes a 50% reduction in the amount of time conventional employed, i.e., about 8 to about 12 seconds. As a result, Cu redeposition is avoided or substantially reduced, thereby significantly improving device reliability.

A wide variety of low-k materials can be employed in accordance with embodiments of the present invention, both organic and inorganic. Suitable organic materials include various polyimies and BCB. Other suitable low-k dielectrics include poly(arylene)ethers, poly(arylene)ether azoles, parylene-N, polyimides, polynapthalene-N, polyphenyl-quinoxalines (PPQ), polyphenyleneneoxide, polyethylene and polypropylene. Other low-k materials suitable for use in embodiments of the present invention include $FO_x$™ (HSQ-based), XLK™ (HSQ-based), and porous SILK™, an aromatic hydrocarbon polymer (each available from Dow Chemical Co., Midland, Mich.), CORAL™ dielectric, a carbon-doped silicon oxide (available from Novellus Systems, San Jose, Calif.), BLACK-DIAMOND™ dielectrics, FLARE™ dielectric, an organic polymer, HOSP™, a hybrid sioloxane-organic polymer, and NANO-GLASS™ dielectric, a nanoporous silica (each available from Honeywell Electronic Materials) and halogen-doped (e.g., fluorine-doped) silicon dioxide derived from tetraethyl orthosilicate (TEOS), fluorine-doped silicate glass (FSG), and SICOH.

The present invention provides cost effective efficient methodology enabling the formation of vias exhibiting significantly reduced via resistance, e.g., about 25%. The present invention enables the formation of semiconductor devices with Cu interconnect structures using various low-k dielectric materials with increased circuit speed, improves reliability, enhanced electromigration resistance, and significantly reduced via resistance. The present invention enjoys industrial applicability in manufacturing highly integrated semiconductor devices exhibiting increased circuit speed and sub-micron features, e.g., with a design rule of about 0.12 micron and under. The present invention enjoys particular applicability in manufacturing highly integrated semiconductor devices with Cu interconnect patterns and low-k dielectric materials, wherein the interconnect patterns exhibit significantly reduced via resistance, enhanced electromigration resistance, improved reliability and rapid circuit speed.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of manufacturing a semiconductor device, the method comprising:
   forming an opening in a dielectric layer exposing an upper surface of a lower metal feature; and
   sequentially treating the opening and upper surface of the lower metal feature with:
   (a) a plasma containing ammonia ($NH_3$) and nitrogen $N_2$; followed by
   (b) a plasma containing nitrogen ($N_2$) and hydrogen ($H_2$).

2. The method according to claim 1, wherein the lower metal feature comprises copper (Cu) or a Cu alloy.

3. The method according to claim 2, wherein the opening is a dual damascene opening comprising a lower via opening connected to an upper trench.

4. The method according to claim 3, wherein the dielectric layer comprises a dielectric material having a dielectric constant less than about 3.9.

5. The method according to claim 4, further comprising filling the opening with Cu or a Cu alloy to form a lower via in electrical contact with the lower metal feature and connected to an upper metal line.

6. The method according to claim 5, further comprising depositing a barrier layer lining the opening before filling the opening with Cu or a Cu alloy.

7. The method according to claim 6, wherein the barrier layer comprises tantalum.

8. The method according to claim 6, further comprising depositing a seedlayer on the barrier layer before filling the opening with Cu or a Cu alloy.

9. The method according to claim 5, comprising:
   (a) treating the opening and upper surface of the lower metal feature with the $NH_3/N_2$ plasma at:
   an $NH_3$ flow rate of about 130 to about 430 sccm;
   a $N_2$ flow rate of about 5,000 to about 9,000 sccm;
   a pressure of about 2.8 to about 6.8 Torr; and
   an RF power of about 100 to about 300 watts; and
   (b) treating the opening and the upper metal surface of the lower metal feature with the $N_2/H_2$ plasma at:
   a $H_2$ flow rate at about 150 to about 350 sccm;
   a $N_2$ flow rate of about 2,000 to about 8,000 sccm;
   a pressure of about 2.8 to about 6.8 Torr; and
   an RF power of about 150 to about 550 watts.

10. The method according to claim 9, comprising:
    conducting the (a) $NH_3/N_2$ plasma treatment for about 10 seconds to about 40 seconds; and
    conducting the (b) $N_2/H_2$ plasma treatment for about 10 seconds to about 40 seconds.

11. The method according to claim 5, comprising sequentially:
    forming a photoresist mask on the dielectric layer;
    anisotropically etching to form the opening;
    stripping the photoresist mask;
    solvent cleaning the opening;
    treating the opening and the upper surface of the lower metal feature with the $NH_3/N_2$ plasma and the $N_2/H_2$ plasma; and
    argon (Ar) sputter etching to remove residual contamination from the opening.

12. The method according to claim 11, comprising Ar sputter etching at:
    an Ar flow rate of about 4 to about 6 sccm;
    a source RF power of about 180 to about 220 watts; and;
    a wafer RF power of about 180 to about 220 watts, for about 4 to about 6 seconds.

* * * * *